United States Patent
Yamamoto et al.

(10) Patent No.: US 6,933,984 B2
(45) Date of Patent: Aug. 23, 2005

(54) TELEVISION TUNER WHICH MAINTAINS UHF BAND TUNING CIRCUIT BANDWIDTH CONSTANT IN LOW TO HIGH BAND RANGE

(75) Inventors: Masaki Yamamoto, Fukushima-ken (JP); Akira Yamamoto, Aomori-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 513 days.

(21) Appl. No.: 09/995,544

(22) Filed: Nov. 28, 2001

(65) Prior Publication Data

US 2002/0063803 A1 May 30, 2002

(30) Foreign Application Priority Data

Nov. 29, 2000 (JP) ........................................ 2000-367752

(51) Int. Cl.[7] ................................................ H04N 5/50
(52) U.S. Cl. .................. 348/731; 455/188.2; 455/180.2
(58) Field of Search ................................ 348/731, 732, 348/733; 455/188.2, 180.2, 180.4, 191.2, 193.1, 193.2, 193.3; H04N 5/50

(56) References Cited

U.S. PATENT DOCUMENTS

| | | | | |
|---|---|---|---|---|
| 4,596,044 A | * | 6/1986 | Aoki et al. | 455/189.1 |
| 4,921,465 A | * | 5/1990 | Hietala et al. | 455/193.3 |
| 5,978,663 A | * | 11/1999 | Yamamoto | 455/193.2 |
| 6,307,600 B1 | * | 10/2001 | Wink | 348/731 |
| 6,342,928 B1 | * | 1/2002 | Ohira | 348/729 |
| 6,392,715 B1 | * | 5/2002 | Sato et al. | 348/731 |

FOREIGN PATENT DOCUMENTS

JP   2001-156593   6/2001

* cited by examiner

*Primary Examiner*—John Miller
*Assistant Examiner*—Trang U. Tran
(74) *Attorney, Agent, or Firm*—Brinks Hofer Gilson & Lione

(57) ABSTRACT

A tuning circuit's bandwidth is maintained almost constant throughout a UHF low to high band range so as to prevent interference by a neighboring channel, particularly in receiving high band television signals, and also to improve NF in receiving low band television signals, eliminating a difference in NF between channels. To realize this, a UHF tuner comprises: a UHF tuning circuit which has a varactor diode first and second inductance elements serially interconnected and connected in parallel with the varactor diode, where the varactor diode 11a varies a tuning frequency within a prescribed frequency range in the UHF band; and impedance means which is serially inserted between an input terminal and the junction of the two inductance elements, where the impedance by the impedance means increases as a frequency increases within the prescribed frequency range in the UHF band.

4 Claims, 2 Drawing Sheets

TELEVISION TUNER WHICH MAINTAINS UHF BAND TUNING CIRCUIT BANDWIDTH CONSTANT IN LOW TO HIGH BAND RANGE

This application claims the benefit of priority to Japanese Application 2000-367752, filed on Nov. 29, 2000.

BACKGROUND OF THE INVENTION

1. Field of the Invention

The present invention relates to a television tuner having a UHF tuner and a VHF tuner, and particularly to a television tuner which makes the selectivity characteristic of an input tuning circuit in the UHF tuner virtually uniform regardless of the channel from which signals are received.

2. Description of Related Art

FIG. 4 shows the configuration of a conventional television tuner which has a UHF tuner and a VHF tuner. As shown in the figure, UHF band television signals and VHF band television signals are inputted from an antenna (not shown) through an input terminal 31. The UHF tuner 40 and the VHF tuner 50 are connected to the input terminal 31 through a highpass filter 32.

The input tuning circuit 41 in the UHF tuner 40 has a varactor diode 41a and first and second inductance elements 41b and 41c which are serially interconnected and connected in parallel with the varactor diode 41a. The cathode of the varactor diode 41a is grounded through a d.c. cut capacitor 4d and one end of the first inductance element 4b is also grounded. The junction of the two inductance elements 4b and 4c is connected to the highpass filter 32 through a coupling capacitor 42.

The tuning frequency of the input tuning circuit 41 varies within a prescribed frequency range in the UHF band according to the tuning voltage Vt applied to the cathode of the varactor diode 4a. A UHF high frequency amplifier 43 is connected next to the input tuning circuit 41. Also, a mixer, etc., which is not shown in the figure, is also provided after the UHF high frequency amplifier 43.

On the other hand, the VHF tuner 50 also has an input tuning circuit, a VHF high frequency amplifier, a mixer or the like, though they are not shown in the FIG.

In this configuration, since the junction of the first inductance element 4b and second inductance element 4c of the input tuning circuit 41 is connected to the input terminal 31 through the coupling capacitor 42, as the impedance in the direction from this junction to the input terminal 31 is converted into a high impedance according to the ratio of the two inductances 4b and 4c and the impedance is connected in parallel with the input tuning circuit 41, and the tuning Q factor is thus determined.

In receiving UHF band television signals, the UHF tuner 40 is activated and the VHF tuner 50 is inactivated; the UHF band television signals selected by the input tuning circuit 41 are inputted to the UHF high frequency amplifier 43. The amplified UHF band television signals are converted into intermediate frequency signals by the mixer.

In receiving VHF band television signals, the VHF tuner 50 is activated and the UHF tuner 40 is inactivated; the VHF band television signals are selected and also converted into intermediate frequency signals by the VHF tuner 50.

It is well known that generally, the Q factor and bandwidth B of a tuning circuit that varies the tuning frequency by means of a varactor diode are expressed by equations $Q=R/\omega L$ and $B=L\times\omega^2/2\pi R$, respectively. Therefore, even when the tuning impedance R (resistance) is constant, the bandwidth B broadens as the frequency increases. In addition, since the impedance of the coupling capacitor 42 in the above conventional tuner circuit configuration varies depending on the frequency, the tuning circuit's loss resistance R including the converted impedance is smaller as the tuning frequency is higher; as a consequence, variation in the bandwidth B is considerable and as shown in FIG. 5, the tuning characteristic curve which represents selectivity is steep (i.e. narrow bandwidth) and insertion loss S is large in UHF low band frequencies while the insertion loss is small and the tuning characteristic curve is gradual (broad bandwidth) in UHF high band frequencies.

Consequently, when low band UHF television signals are received, NF (noise FIG.) deteriorates; when high band UHF television signals are received, interference by television signals from a neighboring channel occurs.

SUMMARY OF THE INVENTION

In view of the above circumstances, the present invention provides a television tuner which prevents interference by a neighboring channel, particularly in receiving high band television signals, by maintaining the tuning circuit bandwidth virtually constant throughout the UHF low to high band range, and thereby improves the NF in receiving low band television signals, eliminating a difference in NF between channels.

In order to achieve the above object, the tuner based on the present invention comprises the following: an input terminal through which UHF band or VHF band television signals are inputted; a UHF tuner which receives the UHF band television signals; and a VHF tuner which is provided together with the UHF tuner and receives at least the VHF band television signals, where the UHF tuner is composed of a UHF tuning circuit having a varactor diode and first and second inductance elements serially interconnected and connected in parallel with the varactor diode, where the varactor diode varies a tuning frequency within a prescribed frequency range in the UHF band; and impedance means serially inserted between the input terminal and the junction of the two inductance elements, where the impedance by the impedance means increases as a frequency increases in the prescribed frequency range.

In addition, the impedance means consists of a series resonance circuit composed of a third inductance element and a capacitance element, where a resonance frequency of the series resonance circuit is set to below the minimum frequency in the prescribed frequency range.

A diode is serially inserted in the impedance means and the diode is turned on when UHF band television signals are received, while it is turned off when VHF band television signals are received.

Furthermore, one end of the first inductance element is grounded and a resonance frequency of the series circuit composed of the diode in the off state, the series resonance circuit and the first inductance element is set to within the UHF band.

Furthermore, a band switching circuit is provided to generate UHF selection voltage and VHF selection voltage which activate or inactivate the UHF tuner and the VHF tuner, respectively, and the UHF selection voltage is applied to the anode of the diode and the VHF selection voltage is applied to its cathode.

BRIEF DESCRIPTION OF THE DRAWINGS

A preferred embodiment of the present invention will be described based on the followings, wherein.

DETAILED DESCRIPTION OF THE PREFERRED EMBODIMENTS

Figure 1:
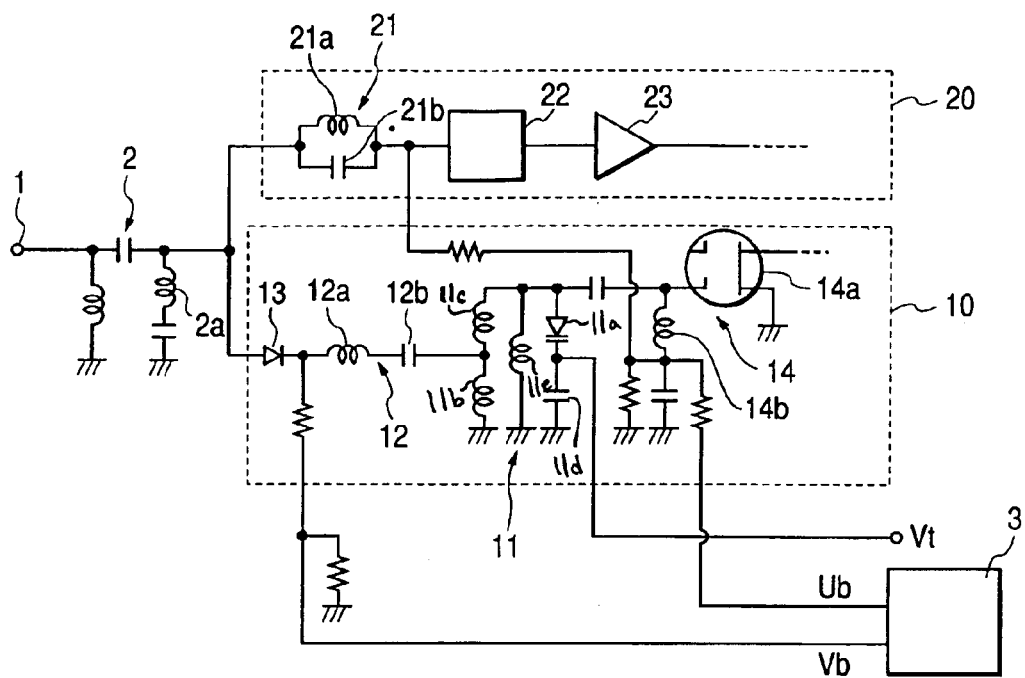
FIG. 1 is a circuit diagram showing the configuration of a television tuner according to the present invention.

FIG. 1 shows the configuration of a television tuner according to the present invention. UHF band television signals and VHF band television signals are inputted through an input terminal 1 from an antenna not shown. The input terminal 1 is connected through a highpass filter 2 to a UHF tuner 10 and a VHF tuner 20. The UHF tuner 10 receives signals of approximately 470 MHz to 800 MHz while the VHF tuner 20 receives VHF band signals and some of UHF band low band signals. The highpass filter 2 allows VHF band or higher frequency signals to pass through it and attenuates intermediate or lower frequency signals; particularly 27 MHz band signals as used for citizen band communication equipment are attenuated by a series resonance circuit 2a.

A UHF input tuning circuit 11 of the UHF tuner 10 has a varactor diode 11a and first and second inductance elements 11b and 11c serially interconnected and substantially connected in parallel with the varactor diode. The cathode of the varactor diode 11a is grounded through a d.c. cut capacitor 11d in accordance with high frequency grounding practices and one end of the first inductance element 11b is also grounded. The varactor diode 11a is connected in parallel with another inductance element 11e, which is intended to compensate for an undesired decrease in the inductance value of the first and second inductance elements 11b and 11c.

Between the junction T of the two inductance elements 11b and 11c, and the highpass filter 2, an impedance means 12, which consists of a series resonance circuit with a third inductance element 12a and a capacitance element 12b as a coupling capacitor, and a diode 13 are interconnected in a series. The resonance frequency of the impedance means 12 is set to below the UHF band low band frequency (470 MHz). As a result, the impedance in the direction from the junction T to the input terminal 1 is converted into a high impedance according to the ratio of the two inductance elements 11b and 11c (a logical explanation of this conversion is omitted here) This is equivalent to the resistance component in the converted impedance being connected in parallel with the UHF input tuning circuit 11.

The orientation of the diode 13 is not limited; in this case, the anode is on the side of the highpass filter 2 and the cathode is on the side of the impedance means 12. VHF selection voltage Vb from a band switching circuit 3 is applied to the cathode of the diode 13. When the diode 13 turns off, it has a capacitance of 0.5 pF to 1.0 pF, so the diode 13 in the off state, the impedance means 12 and the first inductance element 1ib make up a series resonance circuit. The resonance frequency of the circuit is set so as to be within the UHF band.

The tuning frequency of the UHF input tuning circuit 11 varies within a prescribed frequency range, for example, from approximately 470 MHz to 800 MHz depending on the tuning voltage Vt applied to the cathode of the varactor diode 11a. A UHF high frequency amplifier 14 is connected next to the UHF input tuning circuit 11. The UHF high frequency amplifier 14 uses an FET 14a and a peaking coil 14b is connected between the first gate as its input terminal and the ground. The peaking coil 14b compensates for a gain drop of the FET 14a in the UHF band low band (around 470 MHz). UHF selection voltage Ub from the band switching circuit 3 is applied to the first gate of the FET 14a through the peaking coil 14b. A UHF mixer or the like is located after the UHF high frequency amplifier 14, though it is not shown in the FIG.

The VHF tuner 20 comprises: a trap circuit 21 connected to the highpass filter; a VHF input tuning circuit 22 located next to the trap circuit 21; and a VHF high frequency amplifier 23 located next to the VHF input tuning circuit 22. Also, a VHF mixer or the like is located next to the VHF high frequency amplifier 23, though it is not shown in the FIG.

The trap circuit 21, which is designed to attenuate intermediate frequency band signals, consists of a parallel resonance circuit having an inductance element 21a and a capacitor 21b. The inductance element 21a is connected with the anode of the diode 13 in a direct current mode. UHF selection voltage Ub is applied to the anode of the diode 13 through the inductance element 2a.

The band switching circuit 3 generates selection voltages which turn on or off the UHF tuner 10 and the VHF tuner 20. To activate the UHF tuner 10, the UHF selection voltage Ub is set at the high level and the VHF selection voltage Vb at the low level; to activate the VHF tuner, the UHF selection voltage Ub is set at the low level and the VHF selection voltage Vb at the high level.

When UHF band television signals are received, the UHF tuner 10 is activated and the VHF tuner 20 inactivated. Here, the diode 13 turns on and UHF band television signals enter the UHF input tuning circuit 11, where UHF band television signals are selected. The selected UHF band television signals enter the UHF high frequency amplifier 14. The UHF band television signals amplified by the amplifier 14 are converted into intermediate frequency signals by the mixer.

Similarly, when VHF band television signals are received, the VHF tuner 20 is activated and the UHF tuner 10 inactivated. Here, the diode 13 turns off. Therefore, VHF band television signals and some of UHF band television signals are selected by the VHF input tuning circuit 22 and amplified by the VHF high frequency amplifier 23; then they are converted into intermediate frequency signals.

Figure 2:
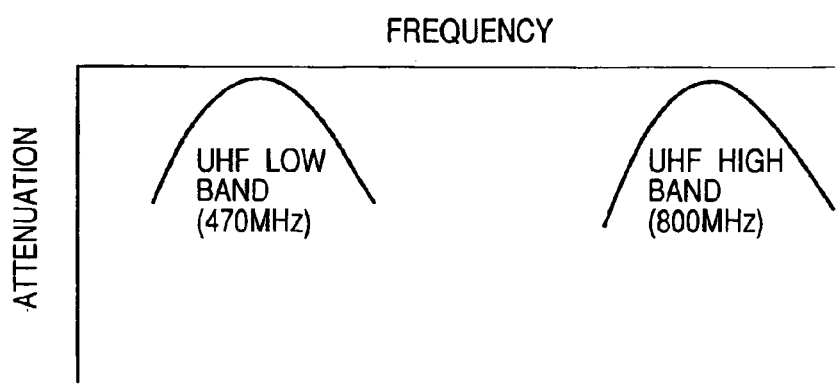
FIG. 2 is a graph showing the UHF band tuning characteristic of the television tuner according to the present invention.

Let's consider the bandwidth B of the UHF input tuning circuit 11. The bandwidth B which represents the tuning characteristic of the UHF input tuning circuit 11 is expressed by the following equation:

$$B = L \times \omega^2 / 2\pi R$$

where L denotes a value nearly equal to the sum of inductance values of the first inductance element 11b and second inductance element 11c and R denotes loss resistance of the tuning circuit 11 (in this case, R includes both the loss resistance of the tuning circuit 11 itself and the resistance component of the impedance after conversion by the two inductance elements 11b and 11c). In this case, as the frequency increases, the impedance by the impedance means 12 increases and the loss resistance R also increases. Consequently, the tuning characteristic is as expressed by the graph in FIG. 2: the graph indicates that the insertion loss in the low band is reduced and there is no significant bandwidth increase in the high band, so the insertion loss and bandwidth are uniform throughout the whole (low to high) band range.

Figure 3:
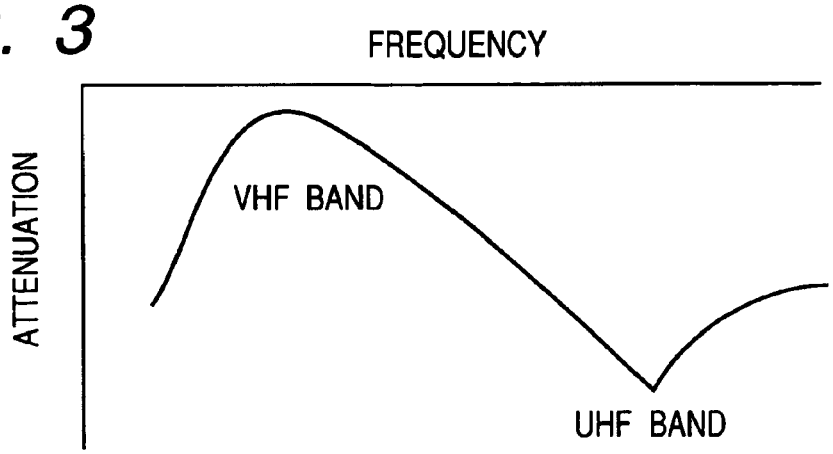
FIG. 3 is a graph showing the VHF band tuning characteristic of the television tuner according to the present invention.
Figure 4:
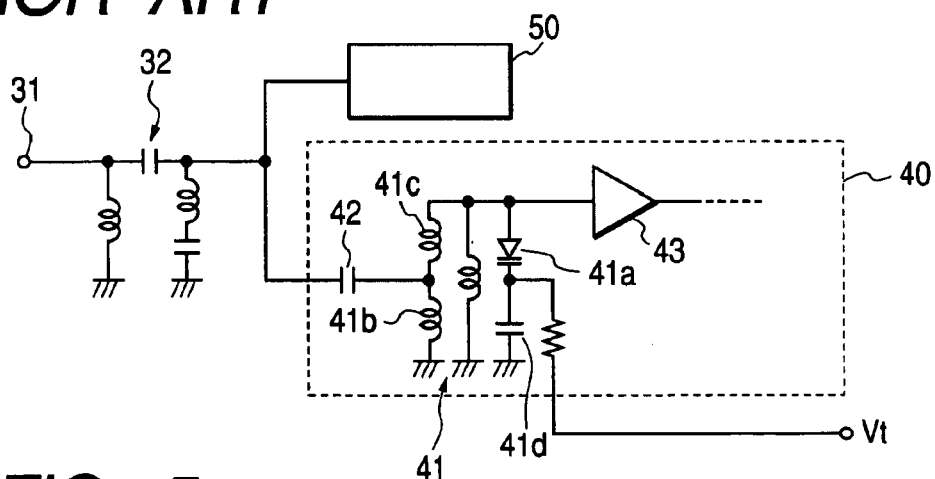
FIG. 4 is a circuit diagram showing the configuration of a conventional television tuner.
Figure 5:
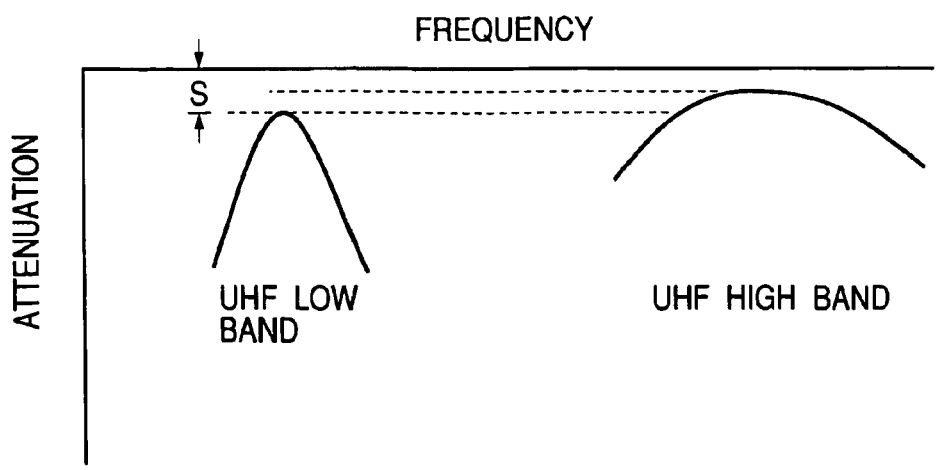
FIG. 5 is a graph showing the UHF band tuning characteristic of the conventional television tuner.

When the VHF tuner 20 is active, UHF band signals are attenuated by the diode 13, the impedance means 12 and the first inductance element 11b, as shown in FIG. 3. This minimizes interference by UHF band television signals when the VHF tuner 20 receives high band television signals.

As discussed so far, the UHF tuner comprises: a UHF tuning circuit which has a varactor diode and a first and a second inductance element serially interconnected and connected in parallel with the varactor diode where the tuning frequency varies within a prescribed frequency range in the UHF band; and an impedance means which is serially inserted between the input terminal and the junction of the two inductance elements, where the impedance by the impedance means increases as the frequency increases within the prescribed frequency range in the UHF band. This reduces insertion loss in the UHF low band and suppresses a bandwidth increase in the UHF highband. So, uniformity in insertion loss and bandwidth is ensured throughout the whole (low to high) band range, which improves NF in the low band and reduces interference by a neighboring channel in the high band.

In addition, the impedance means consists of a series resonance circuit composed of a third inductance element and a capacitance element, where the resonance frequency of the series resonance circuit is set to below the minimum frequency in the prescribed frequency range. Therefore, the impedance by the impedance means can be increased as the frequency is increased within the tuning frequency variable range.

Also, a diode is serially inserted in the impedance means; and the diode is turned on when UHF band television signals are received, while it is turned off when VHF band television signals are received, so that when UHF band television signals are to be received, they can enter the UHF tuner. Also, when VHF television signals are to be received, connection between the VHF tuner and the UHF tuner can be prevented.

Furthermore, one end of the first inductance element is grounded and the resonance frequency of the series circuit composed of the diode in the off state, the series resonance circuit and the first inductance element is set to within the UHF band. So, when television signals are received by the VHF tuner, UHF band television signals are attenuated and thus interference by UHF band television signals is reduced.

Furthermore, a band switching circuit is provided to generate UHF selection voltage and VHF selection voltage which turn on or off the UHF tuner and VHF tuner, respectively, and UHF selection voltage is applied to the anode of the diode and VHF selection voltage is applied to its cathode, so the diode is turned on to activate the UHF tuner and turned off to activate the VHF tuner.

What is claimed is:

1. A television tuner comprising:

an input terminal through which one of UHF band and VHF band television signals are inputted;

a UHF tuner which receives the UHF band television signals; and a VHF tuner which is provided together with the UHF tuner and receives at least the VHF band television signals, the UHF tuner comprising:

a UHF tuning circuit having a varactor diode and first and second inductance elements serially interconnected and connected in parallel with the varactor diode, where the varactor diode vanes a tuning frequency within a prescribed frequency range in the UHF band; and an impedance circuit serially inserted between an input terminal and a junction of the first and second inductance elements, where an impedance of the impedance circuit increases with increasing frequency in the prescribed frequency range, wherein the impedance circuit comprises a series resonance circuit having a third inductance element and a capacitance element, where a resonance frequency of the series resonance circuit is below a minimum frequency in the prescribed frequency range.

2. The television tuner according to claim 1, wherein a diode is serially inserted in the impedance circuit and the diode is turned on when UHF band television signals are received and is turned off when VHF band television signals are received.

3. The television tuner according to claim 2, wherein one end of the first inductance element is grounded and a resonance frequency of the series circuit including the diode in the off state, the series resonance circuit and the first inductance element is within the UHF band.

4. The television tuner according to claim 2, wherein a band switching circuit is provided to generate UHF selection voltage and VHF selection voltage which one of activate and inactivate the UHF tuner and VHF tuner, respectively, and the UHF selection voltage is applied to an anode of the diode and the VHF selection voltage is applied to a cathode of the diode.

* * * * *